ated to vibrate in a fundamental frequency mode and the harmonics thereof in response

United States Patent [19]

Payne

[11] 3,975,650

[45] Aug. 17, 1976

[54] ULTRASONIC GENERATOR DRIVE CIRCUIT

[76] Inventor: Stephen C. Payne, 1114 Charleston National Plaza, Charleston, W. Va. 25301

[22] Filed: Jan. 30, 1975

[21] Appl. No.: 545,463

[52] U.S. Cl. .................................. 310/8.1; 318/116
[51] Int. Cl.² ......................................... H01L 41/08
[58] Field of Search ...................... 310/8.1; 318/116

[56] References Cited
UNITED STATES PATENTS

| | | | |
|---|---|---|---|
| 2,752,512 | 6/1956 | Sarratt | 310/8.1 X |
| 3,371,233 | 2/1968 | Cook | 310/8.1 |
| 3,432,691 | 3/1969 | Shoh | 310/8.1 |
| 3,443,130 | 5/1969 | Shoh | 310/8.1 |
| 3,489,930 | 1/1970 | Shoh | 310/8.1 |
| 3,581,125 | 5/1971 | Arndt | 310/8.1 |
| 3,676,720 | 7/1972 | Libby et al. | 310/8.1 |
| 3,681,626 | 8/1972 | Puskas | 310/8.1 |
| 3,736,523 | 5/1973 | Puskas | 310/8.1 X |
| 3,819,961 | 6/1974 | Bourgeois et al. | 310/8.1 |
| 3,842,340 | 10/1974 | Brandquist | 310/8.1 X |

Primary Examiner—Mark O. Budd
Attorney, Agent, or Firm—Burgess, Dinklage & Sprung

[57] ABSTRACT

The ultrasonic generator comprises a transducer which is adapted to vibrate in a fundamental frequency mode and the harmonics thereof in response to a square wave signal which is applied thereto. The transducer is of the piezoelectric type which has a capacitor loading effect. A square wave generator is provided for generating a square voltage wave and driving means comprising high speed switching transistors is responsive to the signal from the square wave generator for driving the transducer with a square wave. The transistors are switchable between conducting and non-conducting states and are connected to the square wave generator so that the transistors are switched in phase opposition to each other. A non-resonant inductor connects the pair of transistors with the transducer to limit current flow and to permit application of the square wave to the transducer. An alternate embodiment utilizes a balancing transformer to eliminate the normal high common mode switching current.

13 Claims, 3 Drawing Figures

ULTRASONIC GENERATOR DRIVE CIRCUIT

This invention relates generally to an ultrasonic generator and, more particularly, pertains to a highly efficient ultrasonic generator wherein the transducer is made to vibrate simultaneously in both the fundamental frequency resonant mode and the harmonics thereof.

Ultrasonic generators usually comprise an oscillator portion which produces a signal of the desired frequency range, usually in the 10–100 KHz range. The oscillator signal is applied to a transducer that is selected to convert the signal energy into vibrational energy at the frequency under consideration. However, in most applications, the frequency of oscillation of the electric signal corresponds to the mechanical resonant frequency of the transducer to insure that the transducer vibrates at its fundamental frequency. As a result, it has been found that the aforementioned type of construction has been too limited in particular cases.

That is, in many process applications it is desirable to have the transducer vibrate at all possible resonant modes above the primary resonant frequency of the device. The mechanical work performed by the transducer can therefore have a frequency characteristic which gives rise to superior results in particular applications of the device. It has been empirically determined that the vibration of the transducer at the fundamental frequency and harmonics thereof may be accomplished by applying a square wave to the transducer. While such an arrangement has been proposed before, such as shown in U.S. Pat. No. 3,371,233, issued to E. G. Cook on Feb. 27, 1968, no one has disclosed a circuit arrangement that would accomplish the result in an efficient manner.

Accordingly, an object of the present invention is to provide an improved ultrasonic generator.

A more specific object of the present invention is to provide an ultrasonic generator that vibrates in the fundamental mode and the harmonics thereof in a reliable manner.

A further object of the invention resides in the novel details of construction that provide an ultrasonic generator of the type described that is highly efficient in operation.

Accordingly, an ultrasonic generator constructed according to the present invention comprises a transducer which is adapted to vibrate in a fundamantal frequency mode and the harmonics thereof in response to a square wave signal applied thereto. The transducer comprises a piezoelectric device which has a capacitive loading characteristic. A square wave generator is provided for generating the square voltage wave. Driving means is responsive to the signal from the square wave generator for driving the transducer with a square wave. The driving means comprises a pair of bistable devices which are switchable between a conducting and a non-conducting state. Connecting means connects the square wave generator with the pair of bi-stable devices so that the bi-stable devices are switched in phase opposition to each other. A non-resonant induction means connects the pair of bi-stable devices with the transducer so as to provide a coupling therebetween which has little or no effect on the square wave applied to the transducer.

In most instances, it is highly imperative that switching in the driver oscillator be accomplished as quickly as possible while eliminating normal high common mode switching current. Accordingly, a further object of the present invention is the provision of an ultrasonic generator that incorporates fast switching techniques without disturbing the characteristics of the signal applied to the transducer.

A further consideration in ultrasonic generators is to control the amount of power transferred to the transducer by controlling the power factor of the signal at the load. Accordingly, an object of this aspect of the invention is the provision of an ultrasonic generator that senses the power factor of the signal at the transducer and automatically adjusts the same to a desired value.

The above and other features and advantages of the present invention will become more apparent from a consideration of the following detailed description when taken in conjunction with the accompanying drawing, in which.

Figure 1:
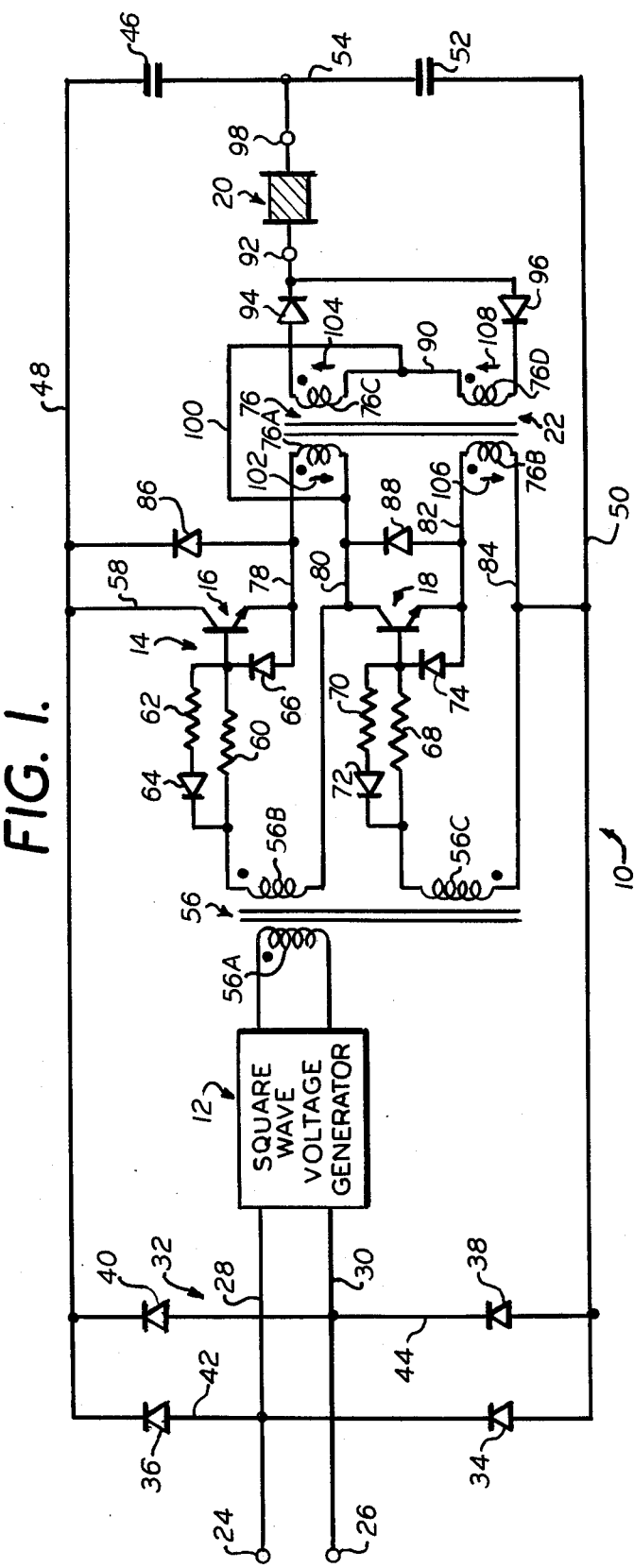
FIG. 1 is a schematic ciruit wiring diagram of an ultrasonic generator constructed according to the present invention.

An ultrasonic generator constructed according to the present invention is designated generally by the reference character 10 in FIG. 1 and operates to apply a square voltage wave form to a piezoelectric transducer to cause the transducer to vibrate at its fundamental resonant frequency and the harmonics thereof. Moreover, the circuit of FIG. 1 permits the switching transistors in the driver portion of the circuit to switch without experiencing the normal high common mode switching current and essentially isolates the switching transistors from the effects of the load current (i.e., the current flowing through the transducer). Generally, the ultrasonic generator of FIG. 1 comprises a square wave voltage generator 12 that supplies a signal to a driver circuit 14 that comprises serially connected transistors 16 and 18. The transistors are driven between conducting and non-conducting states in phase opposition to each other to produce a square wave at their combined output. The output signal from the driver circuit 14 is coupled to a transducer 20 through a coupling network designated generally by the reference character 22. The coupling network is effective to couple the signal from the driver circuit 14 to the transducer 20 and causes extremely fast switching of the transistors from one state to the other while rendering the transducer insensitive to the switching current.

More specifically, the ultrasonic generator 10 comprises a pair of input terminals 24 and 26 that are adapted to be connected to an alternating source of energy such as 120 volts AC. The terminals 24 and 26 are connected to the input terminals of the square wave voltage generator 12 by respective leads 28 and 30. Also connected to the leads 28 and 30 is a full wave diode bridge rectifier designated generally by the reference numeral 32. The bridge rectifier 32 comprises serially connected diodes 34 and 36 and serially connected diodes 38 and 40. The diodes are polarized as shown in FIG. 1, wherein the cathode and anode electrodes of the respective diodes 34 and 36 are connected together and to the lead 28 by a lead 42. A lead 44 connects the cathode and anode electrodes of the respective diodes 38 and 40 together and to the lead 26. The junction of the cathode electrodes of the diodes 36 and 40 are connected to one terminal of a filter capacitor 46 by a lead 48. Similarly, the junction of the anode electrodes of the diodes 34 and 38 are connected by a lead 50 to a terminal of a capacitor 52. The other terminals of the capacitors 46 and 52 are connected together by a lead 54. The output terminals of the generator 12 are connected to the driver circuit 14 by connecting means in the form of a transformer 56 having a primary winding 56A and a pair of secondary windings 56B and 56C. The windings 56B and 56C are arranged so that the signals produced across the windings will be in phase opposition to each other. That is, if it is assumed that the signal at the upper terminal of the winding 56B is positive with respect to the signal at the lower terminal, then the signal at the upper terminal of the winding 56C will be negative with respect to the signal at the lower terminal thereof.

As noted hereinabove, the driver circuit 14 comprises transistors 16 and 18 which are selected to be high speed switching transistors. The collector electrode of the transistor 16 is connected by a lead 58 to the lead 48. The base electrode of the transistor 16 is connected to the collector electrode of the transistor 18 through the series circuit comprising resistor 60 and the secondary winding 56B of the transformer 56. Connected in parallel with the resistor 60 is a series circuit comprising resistor 62 and diode 64. Diode 64 is polarized so that the cathode electrode thereof is connected to the junction of the resistor 60 and the secondary winding 56B of the transformer 56. A clamping diode 66 is connected between the emitter and base electrodes of the transistor 16 and is polarized so that the cathode electrode thereof is connected to the base electrode of the transistor.

Connected between the lead 50 and the base electrode of the transistor 18 is a series circuit comprising a resistor 68 and the secondary winding 56C of the transformer 56. Similarly to the transistor 16, connected in parallel with the resistor 68 is a series circuit comprising a resistor 70 and a diode 72. The diode 72 is polarized so that the cathode electrode thereof is connected to the junction of the resistor 68 and the secondary winding 56C. A clamping diode 74 is connected between the emitter electrode of the transistor 18 and the base electrode thereof and is polarized so that the cathode electrode of the diode is connected to the base electrode of the transistor.

The coupling network 22 comprises a transformer 76 having a pair of primary windings 76A and 76B and a pair of secondary windings 76C and 76D. Preferably, all the windings of the transformer 76 have the same number of turns for reasons which will become apparent herein below. The primary winding 76A is connected between the emitter electrode of the transistor 16 and the collector electrode of the transistor 18 by respective leads 78 and 80. The primary winding 76B is connected between the emitter electrode of the transistor 18 and the lead 50 by respective leads 82 and 84. So-called free-wheeling diodes are connected across the collector-emitter paths of the transistors. More particularly, a diode 86 is connected between the lead 78 and the lead 48 and is polarized so that the cathode electrode thereof is connected to the lead 48. Similarly, a diode 88 is connected between the leads 82 and 80 and is polarized so that the cathode electrode thereof is connected to the lead 80. As is conventional, the diodes 86 and 88 act as clamps to protect the associated transistors.

The secondary windings 76C and 76D of the transformer 76 are connected together by a lead 90. The other terminals of the windings 76C and 76D are connected to one terminal 92 of the transducer 20 through respective diodes 94 and 96. As shown in FIG. 1, the diode 94 is polarized so that the cathode electrode thereof is connected to the terminal 92 and the diode 96 is polarized so that the anode electrode thereof is connected to the terminal 92. The other terminal 98 of the transducer 20 is connected to the lead 54. As noted above, the transducer 20 is a piezoelectric device of conventional construction that is adapted to vibrate in both the fundamental resonant mode and the harmonics thereof.

A lead 100 connects the lead 80 with the lead 90. The windings 76A–76D of the transformer— 76 are polarized as indicated by the dot notation in FIG. 1. The winding 76A is inductively coupled with the winding 76C and the winding 76B is inductively coupled with the winding 76D. Moreover, the primary windings 76A and 76B are inductively coupled together in phase opposition to each other. That is, a signal of one polarity in the winding 76A will induce a signal of the opposite polarity in the winding 76B.

In operation, a signal applied to the input terminals 24 and 26 will be rectified by the diode bridge rectifier 32 to produce a positive polarity signal on the lead 48 and a negative polarity signal on the lead 50. The filter capacitors 46 and 52 will maintain the level of the signal on the lead 54 substantially constant. That is, if it is assumed that 120 volts AC is applied to the terminals 24 and 26, the signal on the lead 54 will be approximately one half the peak value of the input signal or approximately 80 volts DC. Additionally, the square wave voltage generator 12 will be energized to produce a square voltage wave across the primary winding 56A of the connecting transformer 56. The frequency of the square wave generator 12 is chosen to be equal to the fundamental resonant frequency of the transducer 20.

The signal across the primary winding 56A will cause signals to be induced in the secondary windings 56B and 56C which will be in phase opposition to each other. That is, assuming that the top terminal of the winding 56B is positive, the top terminal of the winding 56C will be negative. The positive signal applied to the base electrode of the transistor 16 will cause the transistor to turn on or conduct. Hence, current will flow through the primary winding 76A of the transformer 76 in the direction indicated by the arrowhead 102. Assuming that the transistor 18 is in its non-conducting state, current will flow from the winding 76A through the series circuit comprising lead 80, lead 100, lead 90, secondary winding 76C of the transformer 76, and the diode 94 to the transducer or load 20. Moreover, current through the winding 76C will be in the direction indicated by the arrowhead 104. Current cannot flow through the winding 76D since it is blocked by the polarization of the diode 96. Hence, since the current flow in the windings 76A and 76C are in opposite directions and the number of turns on the windings are equal, the net effect on the switching transistors of the load current will be zero. That is, the effect of the load current will cancel itself out due to the oppositely induced signals caused by the oppositely directed current flow.

Assuming that the square wave input signal to the primary winding 56A reverses itself, a positive signal will now be applied to the base electrode of the transistor 18 while a negative polarity signal will be applied to the base electrode of the transistor 16. During this transient condition, when the transistor 16 is driven its non-conducting state and the transistor 18 is driven into conduction, a high current would normally flow since both transistors would be conducting at the same time. However, in accordance with the present invention, as current begins to flow in the winding 76B in the direction indicated by the arrowhead 106 due to the conduction of the transistor 18, a signal will be induced in the primary winding 76A in a direction opposite to that shown by the arrowhead 102. This oppositely directed signal quickly drives the transistor 16 to its non-conducting state, thereby quickly turning off the transistor to eliminate the high common mode current. Moreover, current flow in winding 76A induces a signal in winding 76B in a direction that causes transistor 18 to turn on slowly thereby eliminating any high common mode current. The base electrode of the transistor 16 that includes the diode 64 permits a high current to be drawn out of the base of the transistor to turn off the transistor hard. The diode 66 acts as a clamp to maintain the reverse potential on the base electrode at a safe level. As in the case of the primary winding 76A and the secondary winding 76C, current will likewise flow in the secondary winding 76D in the direction indicated by the arrowhead 108, so that the net effect of the load current on the switching transistors is again zero.

A consideration of the above operation shows that the transistors 16 and 18 effectively act as bistable devices which are alternately conducting and non-conducting and are in phase opposition to each other. Moreover, the junction of the transistors or bistable devices is connected to the junction of the secondary windings in such a manner as to eliminate the effect of the load current on the switching transistors. The signal applied to the transducer will be a square wave signal which, as noted hereinabove, will cause the transducer to vibrate in both its fundamental mode and all the harmonics thereof.

Piezoelectric devices such as the transducer 20 exhibit a capacitive characteristic. Accordingly, and particularly under conditions wherein fast switching techniques are utilized, a relatively high current may flow during the switching interval. Where the coupling network 22 is not critical, other means may be utilized to couple the driver circuit 14 with the transducer 20 as long as high current flow through the transistors is eliminated. Conventionally, transistors in the switching circuit have been coupled to piezoelectric transducers through inductors that have been designed to cause a resonant circuit with the capacitance exhibited by the transducer. This would insure that a sine wave was applied to the transducer. However, as noted above, the present invention is directed to driving a transducer with a square wave. Accordingly, under such conditions, the circuit shown in FIG. 2 may be utilized.

Figure 2:
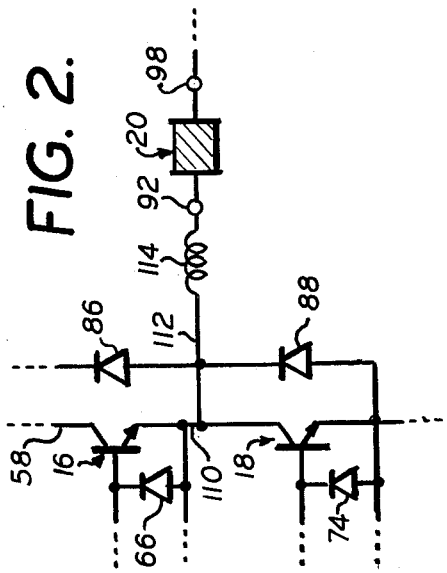
FIG. 2 is an alternate embodiment of the driver oscillator portion of the circuit shown in FIG. 1.

More specifically, the circuit of FIG. 2 is identical to the circuit of FIG. 1 with the exception of the coupling arrangement. Accordingly, only the differences between the circuits of FIG. 1 and FIG. 2 have been illustrated, it being understood that the remainder of the circuits are identical.

More specifically, the emitter electrode of the transistor 16 is connected directly to the collector electrode of the transistor 18 by a lead 110. The junction of the transistors 16 and 18 and the junction of the diodes 88 and 86 are connected together by a lead 112 and to one terminal of an inductance 114, the other terminal of which is connected to the terminal 92 of the transducer 20. The inductance 114 is selected to be non-resonant with respect to the capacitance exhibited by the transducer at the fundamental resonant frequency of the transducer 20 and is selected to be of a value that would limit any high current inrush to the transducer 20. The actual circuit that includes the transistors 16 and 18 operates in the same manner as that described in conjunction with FIG. 1 so that a square wave is again applied to the transducer 20 and yet there is little peturbation of the signal across the transducer.

Figure 3:
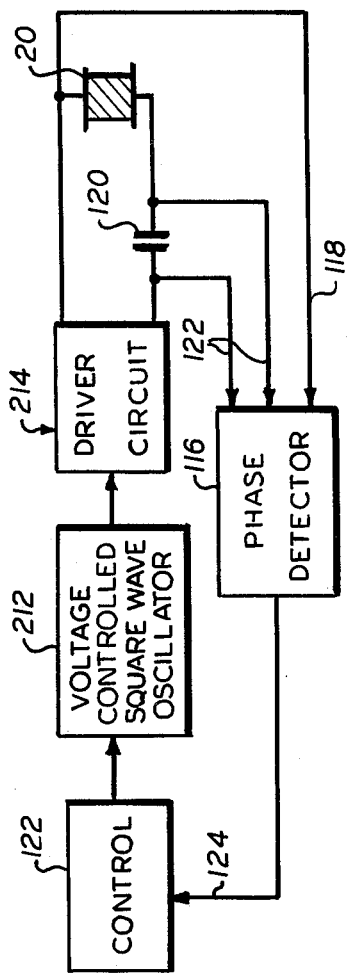
FIG. 3 is a block diagram of an alternate embodiment of an ultrasonic generator of the present invention utilizing feedback techniques for controlling the power factor at the transducer.

In many cases it is desirable to control the power transferred to the transducer 20. One manner in which this is accomplished is to control the power factor at the load or the transducer. For example, U.S. Pat. No. 2,752,512, issued to E. R. Sarratt on June 26, 1956 discloses one such scheme for controlling the power factor at the transducer. However, this patent does not disclose the use of such a system in conjunction with a square wave oscillator or the driver circuit of FIG. 1. Thus, FIG. 3 illustrates such a system wherein the power factor of a square wave signal applied to the transducer is controlled to a desired value. More specifically, a voltage controlled square wave oscillator 212 applies a signal to a driver circuit 214 that may include a coupling arrangement such as the coupling arrangement 22. The output terminals of the driver circuit 214 are connected across a transducer 20. The voltage across the transducer 20 is applied as one input signal to a phase detector 116 by a lead 118. Additionally, a signal representative of the current through the transducer 20, which is derived from the voltage across a capacitor 120 connected in series with the transducer 20 is applied as another input signal to the phase detector 116 via leads 122. The phase detector 116 produces an output signal that is representative of the phase difference between the signals on the leads 118 and 122. More specifically, the output signal of the phase detector 116 is therefore representative of the power factor at the transducer 20. The output signal of the phase detector 116 is applied to a control 122 via a lead 124. The control 122 produces a control signal that is applied to the oscillator 212 to control the frequency thereof.

The normal frequency of the square voltage wave produced by the oscillator 212 is equal to the resonant frequency of the transducer 20. However, the frequency of the oscillator 212 may be made to vary about this normal frequency by application of the proper control voltage thereto as is conventional.

The control 122 may be a summing network that adds the signal on the lead 124 to a preset signal that corresponds to the desired power factor of the signal of the transducer 20.

In operation, the reference signal produced by the control 122 will cause the oscillator 212 to oscillate at a frequency that will produce the desired power factor at the transducer 20. The square wave oscillator 212 will operate the driver circuit 214 in the conventional manner to apply a square wave to the transducer 20. If the power factor is other than desired, the signal on the lead 124 will cause the output signal of the control 122 to vary thereby causing the frequency of the oscillator 212 to change until the power factor is again brought to the desired value.

Accordingly, an ultrasonic generator has been disclosed wherein the transducer is made to vibrate in both its fundamental resonant mode and the harmonics thereof which is extremely reliable in operation.

While preferred embodiments of the invention have been shown and disclosed herein, it will become obvious that numerous omissions, changes and additions may be made to such embodiments without departing from the spirit and scope of the present invention.

What is claimed is:

1. An ultrasonic generator comprising:
   a. a transducer adapted to vibrate in a fundamental frequency mode and the harmonics thereof in response to a predetermined electric signal;
   b. generator means for generating a drive signal,
   c. and driving means responsive to said driving signal for driving said transducer with said predetermined electric signal, said driving means comprising:
      i. a pair of bistable devices each switchable between a conducting and a non-conducting state;
      ii. connecting means for connecting said generator means with said pair of bistable devices for switching said bistable devices between their conducting and non-conducting states in phase opposition to each other in response to said driving signal;
      iii. and coupling means for coupling said pair of bistable devices to said transducer and to each other for applying said predetermined electric signal to said transducer in response to the switching states of said pair of bistable devices and for quickly driving one bistable device to its non-conducting state as the other bistable device begins to conduct, said coupling means comprising a transformer having a pair of primary windings inductively coupled to each other and at least a secondary winding inductively coupled to said pair of primary windings, lead means for connecting said secondary winding in circuit with said transducer, and lead means for connecting each one of said pair of primary windings in circuit with a respective one of said bistable devices and in phase opposition to each other whereby the current induced in one of said pair of primary windings due to the increase of current in the other of said pair of primary windings is in a direction to drive the bistable device connected to said one winding to the non-conducting state.

2. An ultrasonic generator as in claim 1, in which said generator means is a square wave voltage generator.

3. An ultrasonic generator as in claim 2, in which the frequency of said driving signal from said square wave generator is substantially equal to the fundamental frequency mode of vibration of said transducer.

4. A ultrasonic generator as in claim 2, in which said coupling means further comprises a pair of secondary windings each one of which is inductively coupled with a different one of said pair of primary windings, all of said windings having the same number of turns.

5. An ultrasonic generator as in claim 2, in which said pair of bistable devices each comprise a transistor having base, collector and emitter electrodes; and a lead connecting said collector-emitter paths of said transistors in series.

6. An ultrasonic generator as in claim 5, in which said connecting means comprises a transformer having a primary winding connected to said generator means, and a pair of secondary windings, each one of said pair of secondary windings being connected between the base and emitter electrodes of respective ones of said transistors, and in phase opposition to each other so that signals of opposite polarities are induced in said pair of secondary windings.

7. An ultrasonic generator as in claim 5, in which said coupling means comprises a balancing transformer having a pair of inductively coupled primary windings and a pair of secondary windings individually inductively coupled to an associated one of said pair of primary windings, a lead for serially connecting each one of said pair of primary windings in the collector-emitter path of a respective one of said transistors, a lead for serially connecting together said secondary windings with said transducer, and a lead connecting the junction of said transistors to the junction of said secondary windings, and rectifier means connected in circuit with said pair of secondary windings and polarized so that current flowing in one direction in one of said primary windings flows in the opposite direction in the associated secondary winding.

8. An ultrasonic generator as in claim 2, in which said square wave generator has a frequency dependent on a control signal, and power factor sensing means connected to said transducer for producing a signal representative of the power factor of the transducer signal, comparing means connected to said sensing means and said square wave generator for generating said control signal when said sensing means signal is other than a predetermined value representing a desired power factor.

9. An ultrasonic generator as in claim 8, in which said power factor sensing means comprises a phase detector for producing a signal representative of the phase difference between the current through said transducer and said voltage across said transducer.

10. An ultrasonic generator comprising: a transducer adapted to vibrate in a fundamental frequency mode and the harmonics thereof in response to a square wave signal applied thereto, said transducer comprising a piezoelectric device having capacitive loading characteristics; a square wave generator for generating a square voltage wave; and driving means response to the signal from said square wave generator for driving said transducer with a square wave, said driving means comprising: a pair of bistable devices switchable between a conducting and a non-conducting state; connecting means for connecting said square wave generator with said pair of bistable devices so that said bistable devices are switched in phase opposition to each other; and non-resonant induction means connecting said pair of bistable devices with said transducer.

11. An ultrasonic generator as in claim 10, in which said induction means comprises an inductance for limiting current serially connected between the junction of said pair of bistable devices and said transducer.

12. An ultrasonic generator as in claim 10, in which the frequency of said square wave generator is substantially equal to the fundamental frequency of vibration of said transducer.

13. An ultrasonic generator as in claim 10, in which said induction means comprises a balancing transformer.

* * * * *